United States Patent
Liu et al.

(10) Patent No.: US 10,332,888 B2
(45) Date of Patent: Jun. 25, 2019

(54) MEMORY DEVICES AND METHOD OF MANUFACTURING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chih-Chien Liu, Taipei (TW); Chia-Lung Chang, Tainan (TW); Han-Yung Tsai, Tainan (TW); Tzu-Chin Wu, Chiayi County (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 43 days.

(21) Appl. No.: 15/810,145

(22) Filed: Nov. 13, 2017

(65) Prior Publication Data
US 2019/0148382 A1    May 16, 2019

(51) Int. Cl.
*H01L 21/285* (2006.01)
*H01L 27/108* (2006.01)

(52) U.S. Cl.
CPC .. *H01L 27/10852* (2013.01); *H01L 21/28556* (2013.01); *H01L 27/10814* (2013.01); *H01L 27/10823* (2013.01)

(58) Field of Classification Search
CPC .......... H01L 27/10885; H01L 27/1255; H01L 27/1259
See application file for complete search history.

(56) References Cited

U.S. PATENT DOCUMENTS

| | | | |
|---|---|---|---|
| 7,723,770 B2 | 5/2010 | Choi | |
| 8,207,062 B2 | 6/2012 | Gao | |
| 9,299,709 B2 | 3/2016 | Sasaki | |
| 9,577,028 B2 | 2/2017 | Lim | |
| 2011/0233778 A1* | 9/2011 | Lee | C23C 16/34 257/751 |
| 2015/0050807 A1* | 2/2015 | Wu | H01L 21/28556 438/669 |
| 2017/0084643 A1* | 3/2017 | Saraf | H01L 27/1255 |
| 2018/0083010 A1* | 3/2018 | Kusumoto | H01L 27/10885 |

* cited by examiner

*Primary Examiner* — Changhyun Yi
(74) *Attorney, Agent, or Firm* — Winston Hsu

(57) ABSTRACT

A method of manufacturing memory devices is provided in the present invention. The method includes the steps of providing a substrate with multiple capacitors, wherein the capacitor includes a lower electrode layer, an insulating layer and an upper electrode layer and a top plate, forming a tungsten layer on the upper electrode, performing a nitriding plasma treatment to the tungsten layer to form a tungsten nitride layer, and forming a pre-metal dielectric layer on the tungsten nitride layer.

18 Claims, 4 Drawing Sheets

MEMORY DEVICES AND METHOD OF MANUFACTURING THE SAME

BACKGROUND OF THE INVENTION

1. Field of the Invention

The present invention relates to memory devices and method of manufacturing the same, and more specifically, to memory devices with improved adhesion between the tungsten layer and the pre-metal layer for reducing the resistance and method of manufacturing the same.

2. Description of the Prior Art

A semiconductor device such as a DRAM (Dynamic Random Access Memory) has a memory cell area and a peripheral circuit area formed on a principal surface of a semiconductor substrate. The memory cell area includes a plurality of memory cells each having a cell transistor and a storage node. The peripheral circuit area may include various peripheral circuits for performing operations such as read operation and write operation to the memory cells in the memory cell area.

For the past few years, the size reduction has been remarkably progressing in the field of DRAMs. Capacitors used in such DRAMs are formed into a three-dimensional structure in order to ensure a large capacity. The cylinder-type or pillar-type capacitors may provide larger plate area compared to those of the hole-type capacitors. This type of capacitor is formed by providing supporting structures extending vertically from the substrate with a lower electrode, a capacity insulating film, an upper electrode layer and a top plate covering thereon.

While the top plate of the capacitor is formed preferably of silicon germanium (SiGe), a conductive metal layer, such as a tungsten (W) layer, would be formed on the SiGe top plate to reduce the resistance of the cell matrix before the deposition of the subsequent pre-metal dielectric layer. However, poor adhesion between the tungsten layer and the silicon-based pre-metal layer may induce cracking issues at sidewalls of the capacitor structures, especially after packaging. The increased strain in the packaging stage may separate and peel the pre-metal dielectric layer from the tungsten layer.

SUMMARY OF THE INVENTION

The following paragraphs present a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In order to solve the issue of poor adhesion between the tungsten layer and the pre-metal dielectric layer, the approach of the present invention is to form a tungsten nitride layer and/or a tungsten oxide layer on the tungsten layer. The tungsten compound layers have better adhesive property with the silicon-based dielectric layer.

In one aspect of the embodiments, there is provided a method of manufacturing memory devices which includes the steps of providing a substrate with multiple capacitors, wherein the capacitor includes a lower electrode layer, an insulating layer, an upper electrode layer and a top plate, forming a tungsten layer on the top plate, performing a nitriding plasma treatment to the tungsten layer to form a tungsten nitride layer, and forming a dielectric layer on the tungsten nitride layer.

In another aspect of the embodiments, there is provided a method of manufacturing memory devices which includes the steps of providing a substrate with multiple capacitors, wherein the capacitor includes a lower electrode layer, an insulating layer, an upper electrode layer and a top plate, forming a tungsten layer on the top plate, performing an oxidizing plasma treatment to the tungsten layer to form a tungsten oxide layer, and forming a dielectric layer on the tungsten oxide layer.

In still another aspect of the embodiments, there is provided a memory device which includes a substrate, a lower electrode layer on the substrate, an insulating layer on the lower electrode layer, an upper electrode layer on the insulating layer, a top plate on the upper electrode layer, a tungsten layer on the top plate, a tungsten nitride layer on the tungsten layer, and a dielectric layer directly on the tungsten nitride layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Features will become apparent to those of ordinary skill in the art by describing in detail exemplary embodiments with reference to the attached drawings, in which.

Figure 1:
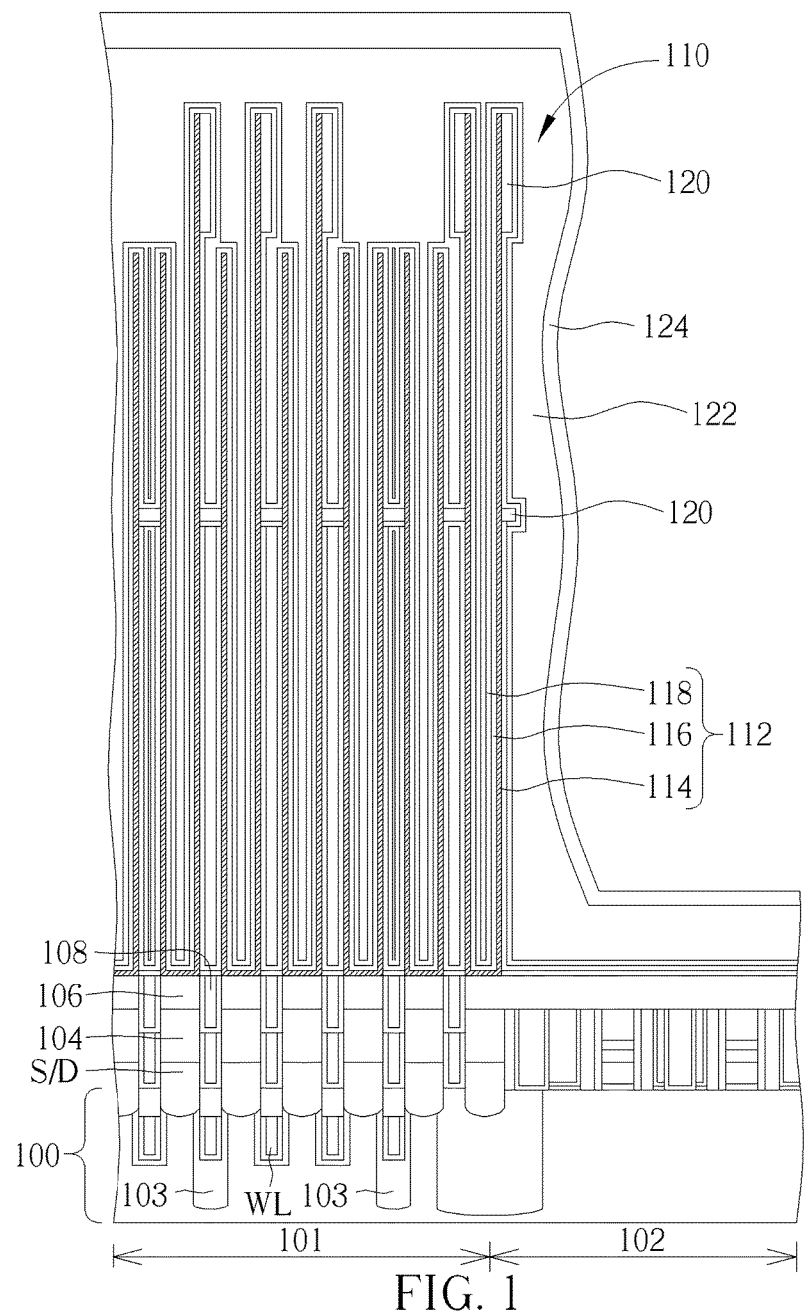
FIGS. 1, 2A, 2B and 3 are schematic cross-sectional views of the manufacturing process of memory devices in accordance with the embodiments of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 2A:
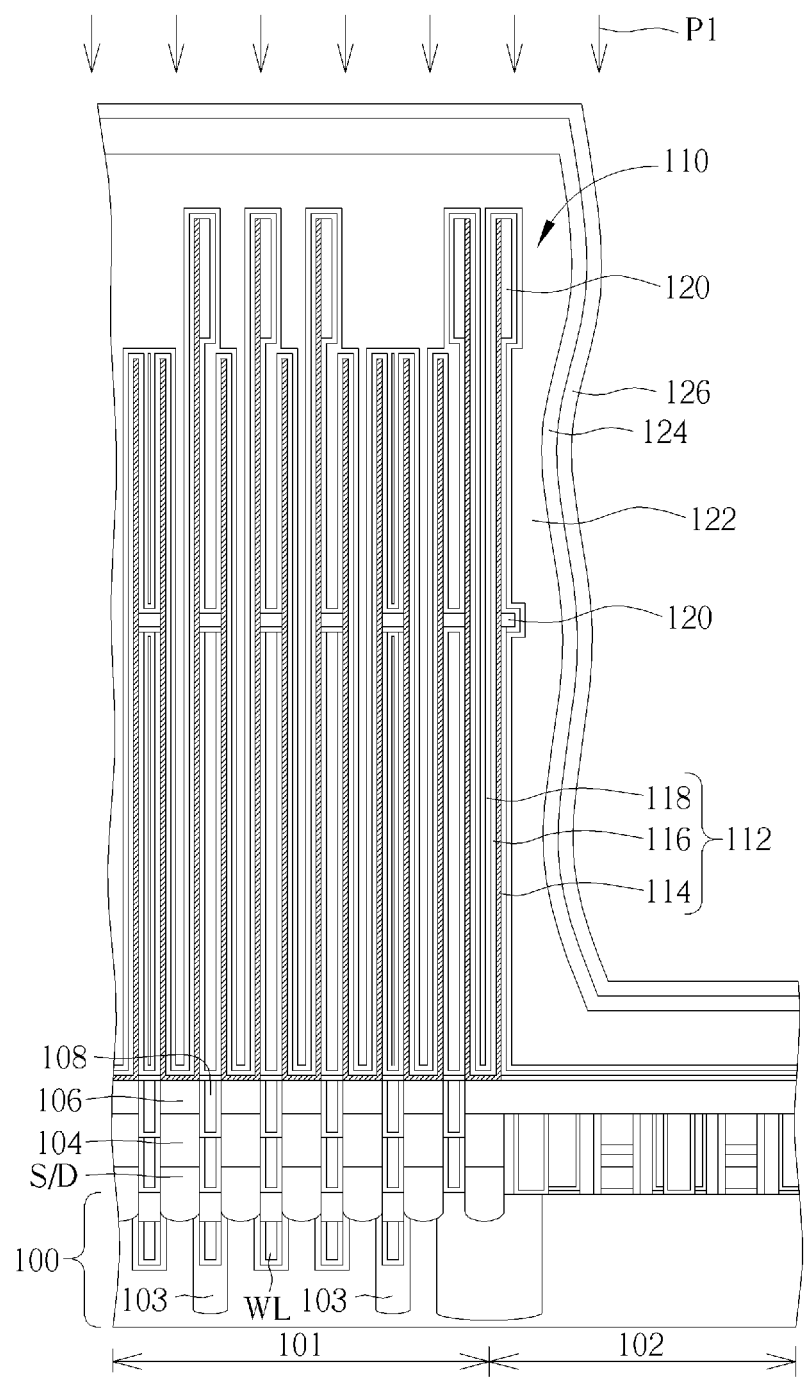
Figure 2B:
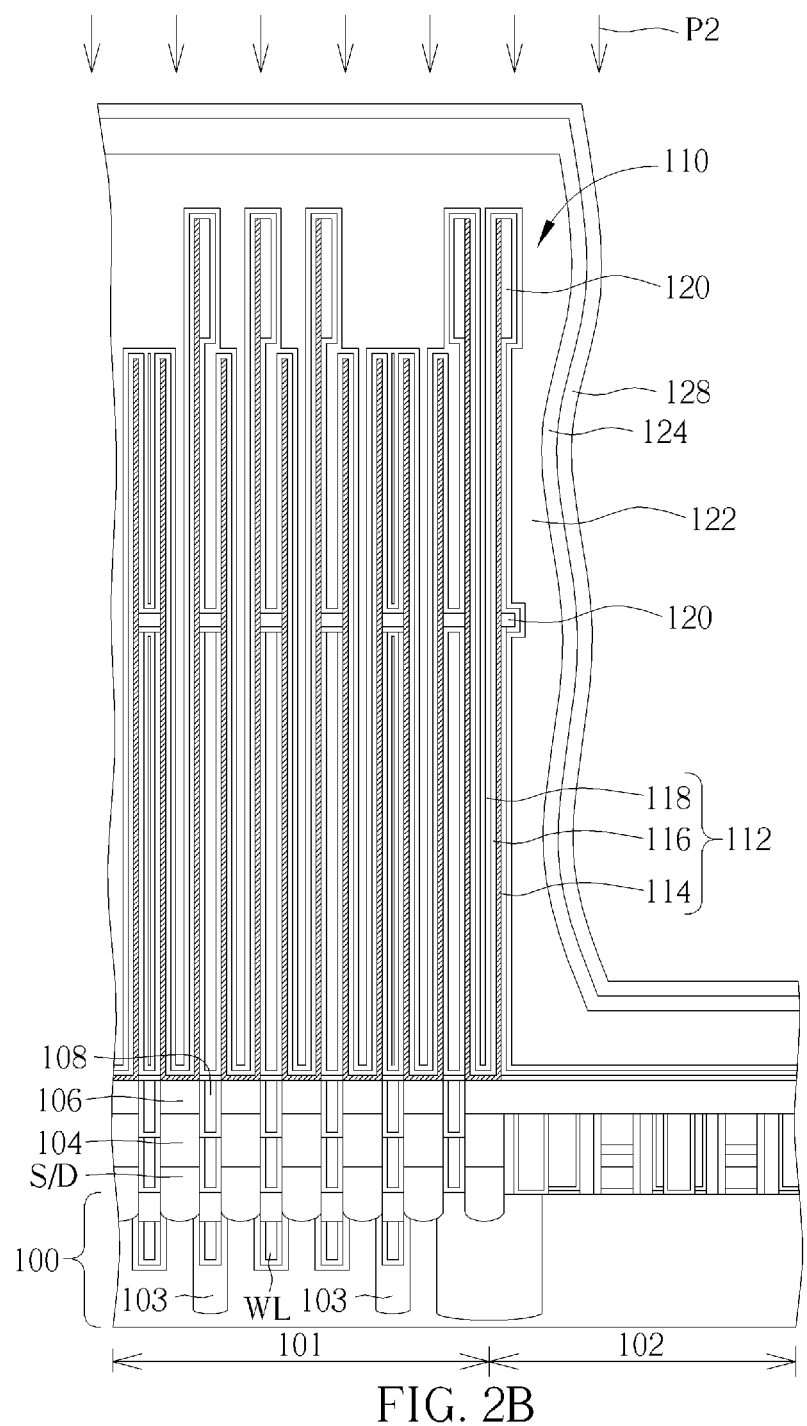

Hereinafter, a manufacturing process of memory devices according to present invention will be described with reference to FIGS. 1, 2A, 2B and 3 in cross-sectional view, wherein FIG. 2A shows the step in one embodiment of the present invention, and FIG. 2B shows the step in other embodiment of the present invention. Some components are enlarged, reduced in size, or omitted for easy understanding and preventing obscuring the subject matters of the present invention.

First, please refer to FIG. 1. A semiconductor substrate 100 is provided with cell regions 101 and periphery regions 102 defined thereon. The substrate 100 may be silicon substrate, silicon-on-isolator (SOI) substrate, or silicon-germanium substrate. Isolation structures 103 are formed of silicon oxide, silicon nitride or silicon oxynitride in the substrate 100, to define active regions in the cell region 101.

Word lines WL are formed in advance in the substrate 100 to serve as gates for controlling the switch of memory devices. Dopants such as p-type dopants or n-type dopants are doped into the actives region at both sides of the word lines WL to form source/drain S/D. Storage node contacts 104 are formed on source/drain S/D to further connect contact pads 106 and capacitors formed thereon. The stack of each source/drain S/D, storage node contact 104 and contact pad 106 are spaced apart by spacers 108 and each corresponds to one capacitor unit above.

A capacitor structure 110 is formed on the cell region 101 with multiple capacitor units 112 connecting respectively with the contact pads 106 below. In the embodiment, each capacitor unit 112 includes a lower electrode 114, an insulating layer 116 and an upper lower electrode layer 118. The material of the lower electrode layer 114 and upper lower electrode layer 118 may be titanium nitride (TiN). The insulating layer 116 may be a stack of alternating $ZrO_2$—$Al_2O_3$—$ZrO_2$ (ZAZ) films. Supporting structures 120 are formed surrounding the capacitor units 112 to provide structural strength and separate them from each other.

A conductive top plate 122 is formed on the surface of the upper electrode layer 118 of the capacitor structure 110. The material of top plate 122 may be silicon, silicon germanium (SiGe) or silicon phosphorus (SiP) with the doping of boron (B) or phosphorus (P). A tungsten (W) layer 124 is formed on the top plate 122 to reduce the resistance of cell matrix. The tungsten layer 124 may be formed by plasma-enhanced chemical vapor deposition (PECVD) and sputtering with a thickness about 700 angstrom (Å). In addition, a thin native tungsten oxide layer (not shown) may grow on the surface of the tungsten layer 124 because the wafer surface is exposed to the air environment with the coexistence of oxygen and water or moisture at room temperature.

Please refer to FIG. 2A. After the tungsten layer 124 is formed, a nitriding plasma treatment P1 is performed to form a tungsten nitride (WN) layer on the surface of the tungsten layer 124. The nitriding plasma treatment P1 may be ammonia ($NH_3$) plasma treatment using ammonium ions to nitride the tungsten layer 124. Alternatively, the nitriding plasma treatment P1 may be a remote plasma treatment using electrically neutral ammonium radical to nitride the tungsten layer 124. Please note that in the embodiment, the nitriding plasma treatment P1 may be an in-situ plasma treatment performed in the same chamber or recipe as the forming of the tungsten layer 124. In an alternative embodiment, the nitriding plasma treatment P1 may be an in-situ plasma treatment performed in the same chamber or recipe as the forming of subsequent pre-metal dielectric layer 130. The tungsten nitride layer 126 formed in this treatment would be conformal, i.e. with uniform thickness, on the surface.

In another embodiment of the present invention, please refer to FIG. 2B, an oxidizing plasma treatment P2 rather than a nitriding plasma treatment P1 may be performed to the tungsten layer 124 to form an tungsten oxide layer 128 on the surface of the tungsten layer 124. The oxidizing plasma treatment P2 may be plasma treatment using $N_2O$, $CO_2$ or CO ions to oxidize the tungsten layer 124. Alternatively, the oxidizing plasma treatment P2 may be a remote plasma treatment using neutral $N_2O$, $CO_2$ or CO radical to oxidize the tungsten layer 124. Please note that in the embodiment, the oxidizing plasma treatment P2 may be an in-situ plasma treatment performed in the same chamber or recipe as the forming of the tungsten layer 124. In an alternative embodiment, the oxidizing plasma treatment P2 may be an in-situ plasma treatment performed in the same chamber or recipe as the forming of subsequent pre-metal dielectric layer 130. The tungsten oxide layer 128 formed in this treatment would be conformal, i.e. with uniform thickness, on the surface. In comparison to the native tungsten oxide layer mentioned above, the tungsten oxide layer 128 formed in this treatment would be a compact layer structure with good uniformity and homogeneity, thus it can provide better adhesion with the pre-metal dielectric (PMD) layer to be formed thereon in later process.

Figure 3:
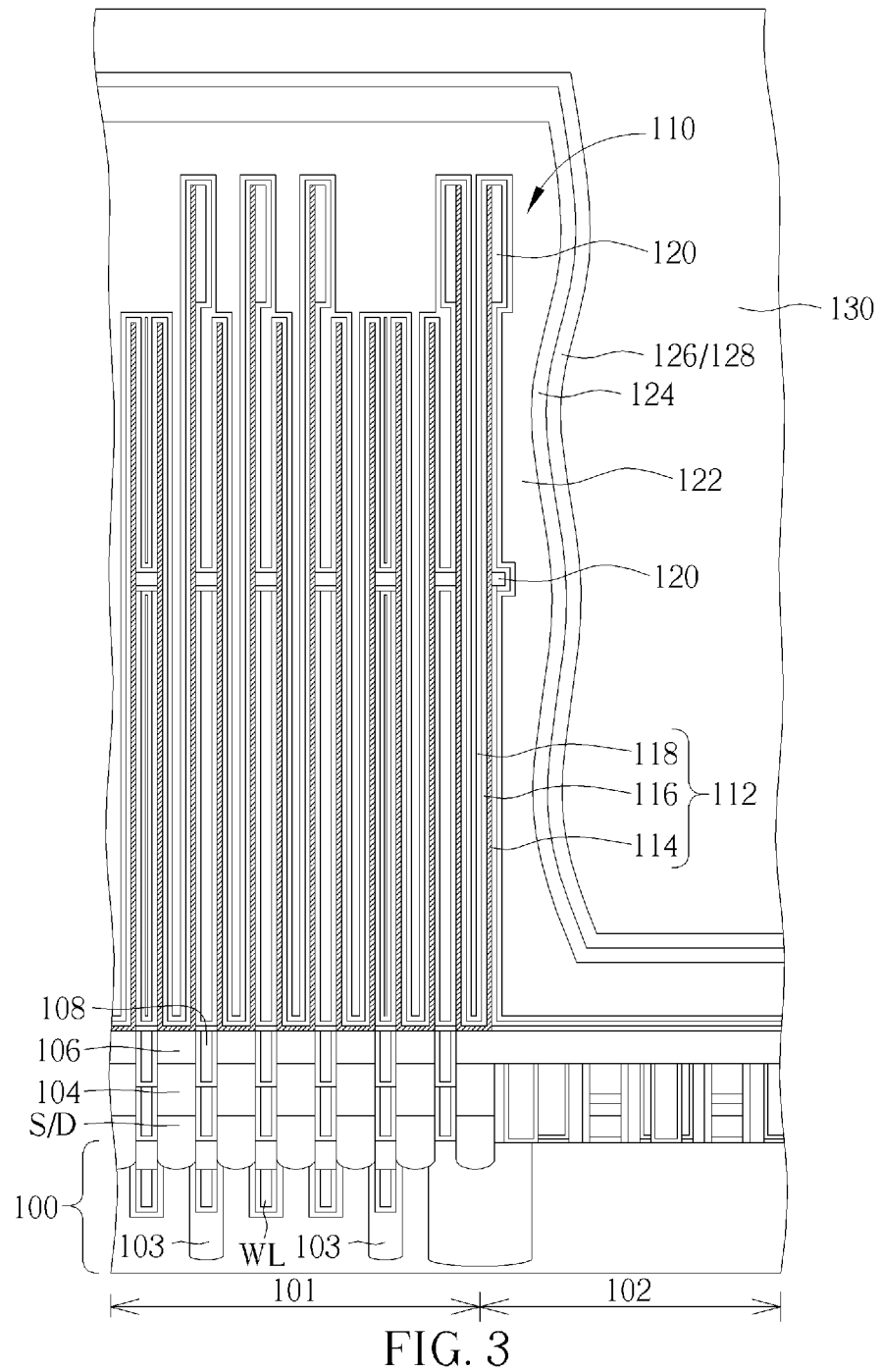

Please refer to FIG. 3. After the tungsten nitride layer 126 or the tungsten oxide layer 128 is formed, a pre-metal dielectric layer 130 is directly blanket deposited on the entire substrate 100. The pre-metal dielectric layer 130 may be formed by CVD process to cover the cell regions 101 including the entire top plate structure and the peripheral regions 102. The pre-metal dielectric layer 130 may be a single dielectric layer or multiple dielectric layers. The material of pre-metal dielectric layer 130 may include silicon oxide, silicon nitride, silicon oxynitride, silicon carbide, silicon carbon nitride, or a combination thereof. The deposited pre-metal dielectric layer 130 would be planarized by a chemical mechanical polishing (CMP) process. Contact holes and contacts (not shown) would then be formed in the pre-metal dielectric layer 130 on the peripheral region 102 in later process to connect the semiconductor devices below, such as bit lines.

In the present invention, since the tungsten nitride layer 126 or the tungsten oxide layer 128 is intermediate between the tungsten layer 124 and pre-metal dielectric layer 130, the problem of poor adhesion between metal-based tungsten layer 124 and silicon-based pre-metal dielectric layer 130 is properly solved. The tungsten nitride layer 126 or the tungsten oxide layer 128 is used instead of the tungsten layer 124 to construct better bonding with the pre-metal dielectric layer 130 to achieve better adhesion.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing memory devices, comprising:

providing a substrate with multiple capacitors formed on said substrate, wherein each of said multiple capacitors comprises a lower electrode layer, an insulating layer, an upper electrode layer and a top plate directly contacting said upper electrode layer;

forming a tungsten layer directly contacting said top plate;

performing a nitriding plasma treatment to a surface portion of said tungsten layer to form a tungsten nitride layer on said tungsten layer; and forming a dielectric layer directly on said tungsten nitride layer.

2. The method of manufacturing memory devices of claim 1, wherein said nitriding plasma treatment is an ammonia plasma treatment.

3. The method of manufacturing memory devices of claim 1, wherein said nitriding plasma treatment is a remote plasma treatment.

4. The method of manufacturing memory devices of claim 1, wherein said tungsten layer is formed by plasma-enhanced chemical vapor deposition.

5. The method of manufacturing memory devices of claim 4, wherein said nitriding plasma treatment is an in-situ plasma treatment in said plasma-enhanced chemical vapor deposition.

6. A method of manufacturing memory devices, comprising:

providing a substrate with multiple capacitors formed on said substrate, wherein said capacitor comprises a lower electrode layer, an insulating layer, an upper electrode layer and a top plate directly contacting said upper electrode layer;

forming a tungsten layer directly contacting on said top plate;

performing an oxidizing plasma treatment to a surface portion of said tungsten layer to form a tungsten oxide layer on said tungsten layer; and forming a dielectric layer directly on said tungsten oxide layer.

7. The method of manufacturing memory devices of claim 6, wherein said oxidizing plasma treatment uses at least one of $N_2O$, $CO_2$ and $CO$.

8. The method of manufacturing memory devices of claim 6, wherein said oxidizing plasma treatment is a remote plasma treatment.

9. The method of manufacturing memory devices of claim 6, wherein said tungsten layer is formed by plasma-enhanced chemical vapor deposition.

10. The method of manufacturing memory devices of claim 9, wherein said oxidizing treatment is an in-situ treatment in said plasma-enhanced chemical vapor deposition.

11. A memory devices, comprising:

a substrate;

multiple capacitors on said substrate, wherein each of said multiple capacitors comprises:

a lower electrode layer on said substrate;

an insulating layer on said lower electrode layer;

an upper electrode on said insulating layer;

a top plate directly contacting said upper electrodes of multiple capacitors;

a tungsten layer directly contacting said top plate;

a tungsten nitride layer on said tungsten layer; and a dielectric layer directly on said tungsten nitride layer.

12. The memory devices of claim 11, wherein said tungsten nitride layer is a conformal layer.

13. The memory devices of claim 11, wherein material of said top plate is a silicon-germanium.

14. The memory devices of claim 11, further comprising a native tungsten oxide layer between said tungsten layer and said tungsten nitride layer.

15. The memory devices of claim 11, wherein material of said lower electrode layer and said upper electrode layer is titanium nitride.

16. The memory devices of claim 11, wherein said insulating layer is a stack of alternative $ZrO_2$—$Al_2O_3$—$ZrO_2$ (ZAZ) films.

17. The memory devices of claim 11, wherein said dielectric layer includes single dielectric layer or multiple dielectric layers.

18. The memory devices of claim 11, wherein material of said dielectric layer includes silicon oxide, silicon nitride, silicon oxynitride, silicon carbide, silicon carbon nitride, or a combination thereof.

* * * * *